(12) United States Patent
Lan

(10) Patent No.: US 7,741,198 B2
(45) Date of Patent: Jun. 22, 2010

(54) METHOD FOR FABRICATING A PROBING PAD OF AN INTEGRATED CIRCUIT CHIP

(75) Inventor: Chien-Ming Lan, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 236 days.

(21) Appl. No.: 12/164,101

(22) Filed: Jun. 29, 2008

(65) Prior Publication Data
US 2008/0258748 A1 Oct. 23, 2008

Related U.S. Application Data

(62) Division of application No. 11/306,062, filed on Dec. 15, 2005, now Pat. No. 7,456,479.

(51) Int. Cl.
H01L 21/20 (2006.01)
H01L 21/36 (2006.01)
H01G 9/20 (2006.01)

(52) U.S. Cl. ............. 438/497; 438/478; 257/E23.014

(58) Field of Classification Search ............ 438/497, 438/478, 612, 613, 614, 753; 257/E23.014, 257/E23.024
See application file for complete search history.

(56) References Cited

U.S. PATENT DOCUMENTS

| 3,556,951 | A | * | 1/1971 | Cernigilia et al. | ........... 438/656 |
| 5,574,311 | A | * | 11/1996 | Matsuda | ..................... 257/697 |
| 5,843,798 | A | * | 12/1998 | Matsuda | ..................... 438/106 |
| 5,869,903 | A | * | 2/1999 | Nakatani et al. | ............ 257/777 |
| 6,881,654 | B2 | * | 4/2005 | Chen et al. | .................. 438/497 |
| 7,271,034 | B2 | * | 9/2007 | Brunschwiler et al. | ...... 438/119 |
| 2002/0179991 | A1 | * | 12/2002 | Varrot et al. | ................ 257/459 |
| 2005/0224975 | A1 | * | 10/2005 | Basavanhally et al. | ...... 257/741 |
| 2007/0007618 | A1 | * | 1/2007 | Hasunuma et al. | .......... 257/508 |
| 2007/0155029 | A1 | * | 7/2007 | Hamren et al. | ................ 438/17 |
| 2007/0182001 | A1 | * | 8/2007 | Kanzaki et al. | ............. 257/734 |
| 2007/0241416 | A1 | * | 10/2007 | Muramatsu | ................. 257/431 |
| 2008/0001306 | A1 | * | 1/2008 | Basavanhally et al. | ...... 257/777 |

* cited by examiner

Primary Examiner—Walter L Lindsay, Jr.
(74) Attorney, Agent, or Firm—Winston Hsu

(57) ABSTRACT

A method for fabricating a probing pad is disclosed. A substrate having thereon a dielectric layer is provided. An inlaid metal wiring is formed in the dielectric layer. The inlaid metal wiring and the dielectric layer are covered with a passivation dielectric film. A portion of the passivation dielectric film is then etched away to form a reinforcement pattern on the inlaid metal wiring. The reinforcement pattern has inter-space that exposes a portion of the underlying inlaid metal wiring. A conductive pad is formed over the reinforcement pattern and the passivation dielectric film. The conductive pad fills the inter-space of the reinforcement pattern.

22 Claims, 7 Drawing Sheets

METHOD FOR FABRICATING A PROBING PAD OF AN INTEGRATED CIRCUIT CHIP

CROSS REFERENCE TO RELATED APPLICATIONS

This application is a division of U.S. application Ser. No. 11/306,062 filed Dec. 15, 2005.

BACKGROUND OF THE INVENTION

1. Field of the Invention

The present invention relates generally to the fabrication of semiconductor integrated circuits and, more particularly, to a method for fabricating a probing pad of an integrated circuit chip.

2. Description of the Prior Art

In the manufacturing process of integrated circuits (ICs) and chips, a testing operation is a commonly used step. Each IC, whether the IC is in the wafer scale or in the packaging state, has to be tested through a standard testing procedure to ensure functions of each circuit of the IC. Generally speaking, accuracy and speed of a testing procedure are required because of two main concerns: new design of ICs and yield. As IC design progresses the ICs have more functions, and the inner circuits of the ICs become more complicated. Therefore, the accuracy of the testing procedure also becomes more essential.

The testing procedure of testing a single die of a wafer in the above-mentioned wafer scale is also called wafer probing. As known by those skilled in the art, wafer probing is an essential test in IC manufacturing, and it is mainly used to detect device characteristics of each die on the wafer by establishing a temporary electronic contact between an external testing device and the dies on the wafer. Therefore, the produced ICs that conform to the needed specification are selected from the whole wafer before all dies are separated and packaged. Furthermore, the yield of the wafer can be determined through the wafer probing. Therefore, engineers could know the problems of wafer manufacturing by analyzing the yield. In other words, if the yield is a high percentage, this means that the manufacturing procedure is correct, otherwise, if the yield is a low percentage, this means that some problems may have occurred in the manufacturing procedure and some steps of the manufacturing procedure need to be examined again.

FIG. 1 is a cross-sectional, schematic diagram illustrating a transition state during the probing process utilizing a probe tip 30 according to the prior art method. As shown in FIG. 1, a metal layer 14 is formed in a base layer 12 of the chip 10. The metal layer 14 is initially covered by a passivation layer 24. An etching process is then implemented to form a via opening 28 exposing a portion of the underlying metal layer 14. After the formation of the via opening 28, an aluminum pad 16 is formed on the metal pad 14. The probe tip 30 is moved down to touch the aluminum pad 16 through the via opening 28. To ensure good contact between the probe tip 30 and the aluminum pad 16, the probe tip 30 laterally moves a short distance on the surface of the pad 16. This action often results in an uplifted probe mark 36.

When the interconnection of the IC chip employs a copper system and uses low-k materials as insulation layers, the aforesaid probing process directly performed on the aluminum pad 16 may result in exposed copper portion 38 on the metal layer 14 or cracking in the insulation layer due to overly large probing force. It is disadvantageous to expose the underlying copper metal layer 14 because the exposed copper may be oxidized thus damages the chip.

SUMMARY OF THE INVENTION

It is an object of this invention to provide a method for fabricating a probing pad of an integrated circuit in order to solve the above-mentioned problems.

According to the claimed invention, a method for fabricating a probing pad of an integrated circuit chip is disclosed. A substrate having thereon a dielectric layer is provided. An inlaid metal wiring is formed in the dielectric layer. The inlaid metal wiring has an exposed top surface. The top surface of the inlaid metal wiring and the dielectric layer is covered with a passivation dielectric film. A portion of the passivation dielectric film is then etched away to form a reinforcement pattern on the inlaid metal wiring. The reinforcement pattern has inter-space that exposes a portion of the underlying inlaid metal wiring. A conductive pad is formed over the reinforcement pattern and the passivation dielectric film. The conductive pad fills the inter-space of the reinforcement pattern These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
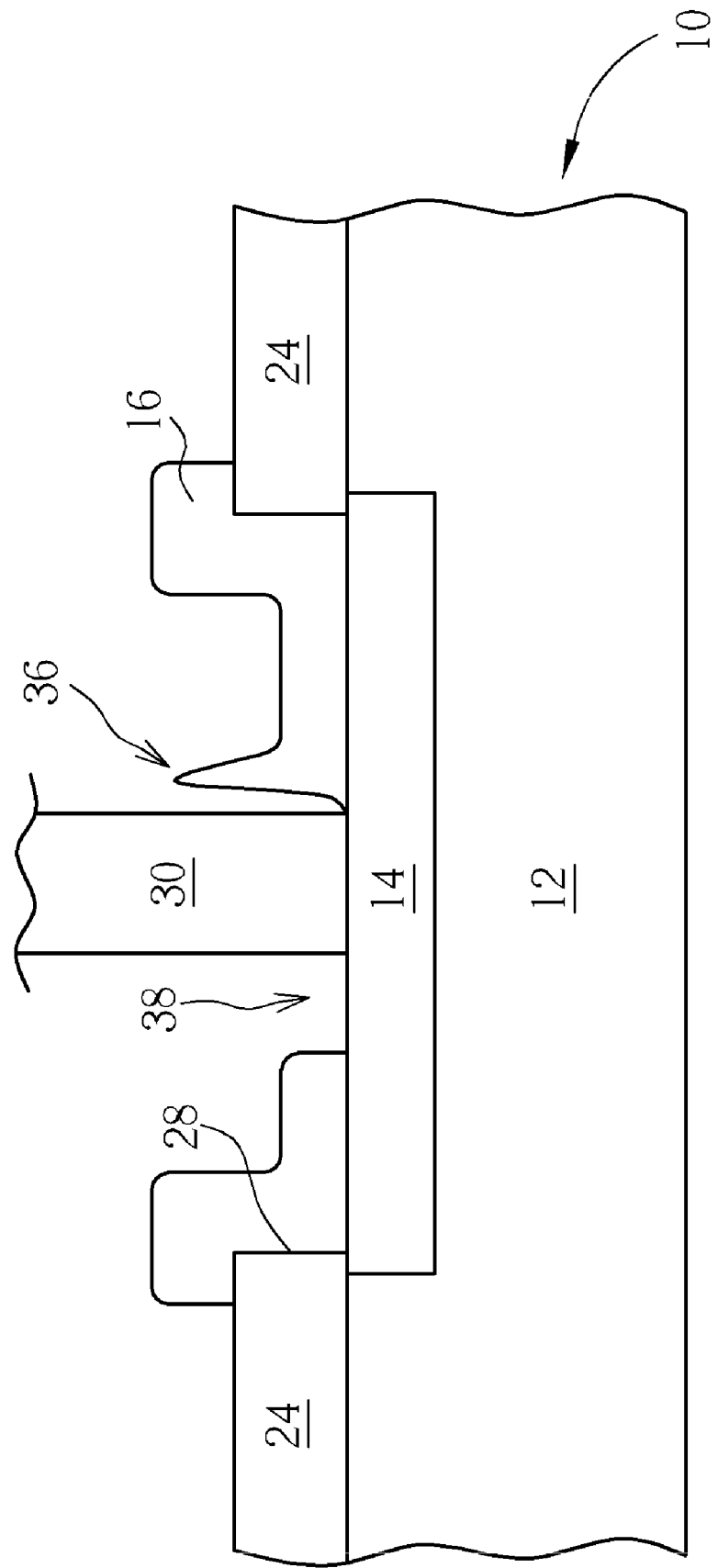
FIG. 1 is a cross-sectional, schematic diagram illustrating a transition state during the probing process utilizing a probe tip according to the prior art method.
Figure 2:
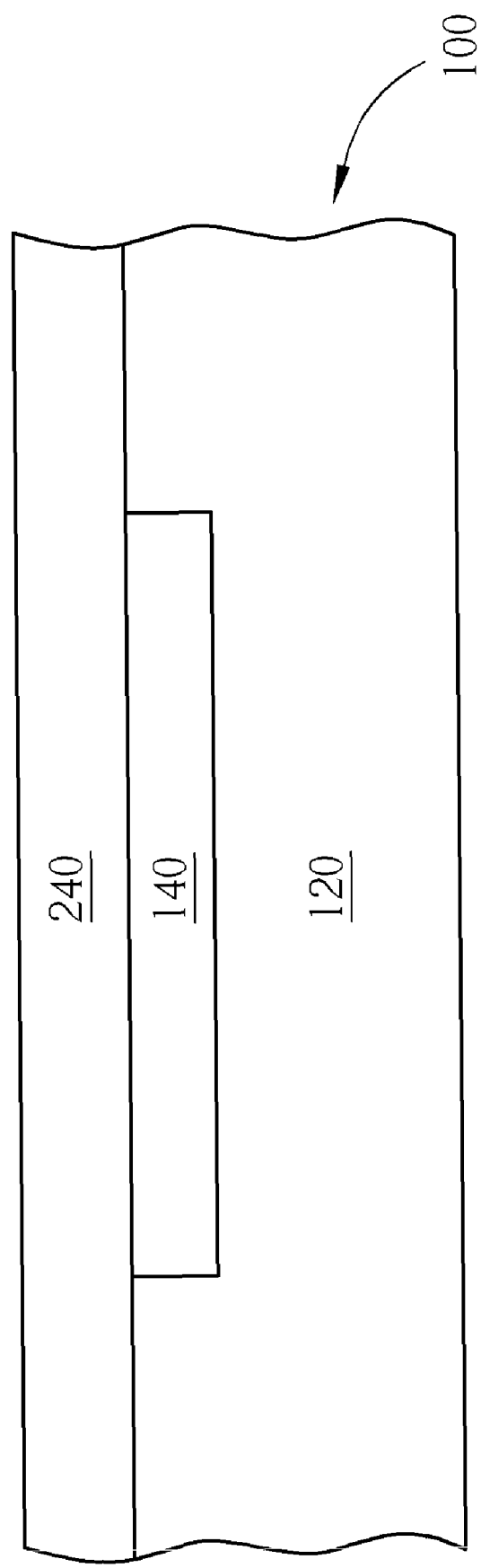
FIGS. 2-6 are schematic, cross-sectional diagrams illustrating a method for fabricating a probing pad of an integrated circuit chip in accordance with one preferred embodiment of this invention.

Please refer to FIGS. 2-6. FIGS. 2-6 are schematic, cross-sectional diagrams illustrating a method for fabricating a probing pad of an integrated circuit chip in accordance with one preferred embodiment of this invention. As shown in FIG. 2, a semiconductor integrated circuit chip 100 comprises thereon a base layer 120. It is understood that the base layer 120 may comprises various integrated circuit elements such as transistors, memory or logic devices and interconnection metal layers, which are not shown for the sake of simplicity.

A copper wiring layer 140 is embedded in the base layer 120. The copper wiring layer 140 may be surrounded by low dielectric constant materials, but not limited thereto. The copper wiring layer 140 has an exposed top surface.

The copper wiring layer 140 may be formed by etching a damascene trench into the base layer 120, then filling the damascene trench with copper, followed by chemical polishing the excess copper outside trench. A diffusion barrier (not shown) may be formed between the copper wiring layer 140 and the base layer 120 to prevent copper diffusion.

A passivation dielectric film 240 is deposited to cover the copper wiring layer 140 and the base layer 120. The passivation dielectric film 240 may include silicon oxide, silicon nitride, silicon oxy-nitride, polyimide or the like.

Figure 3:
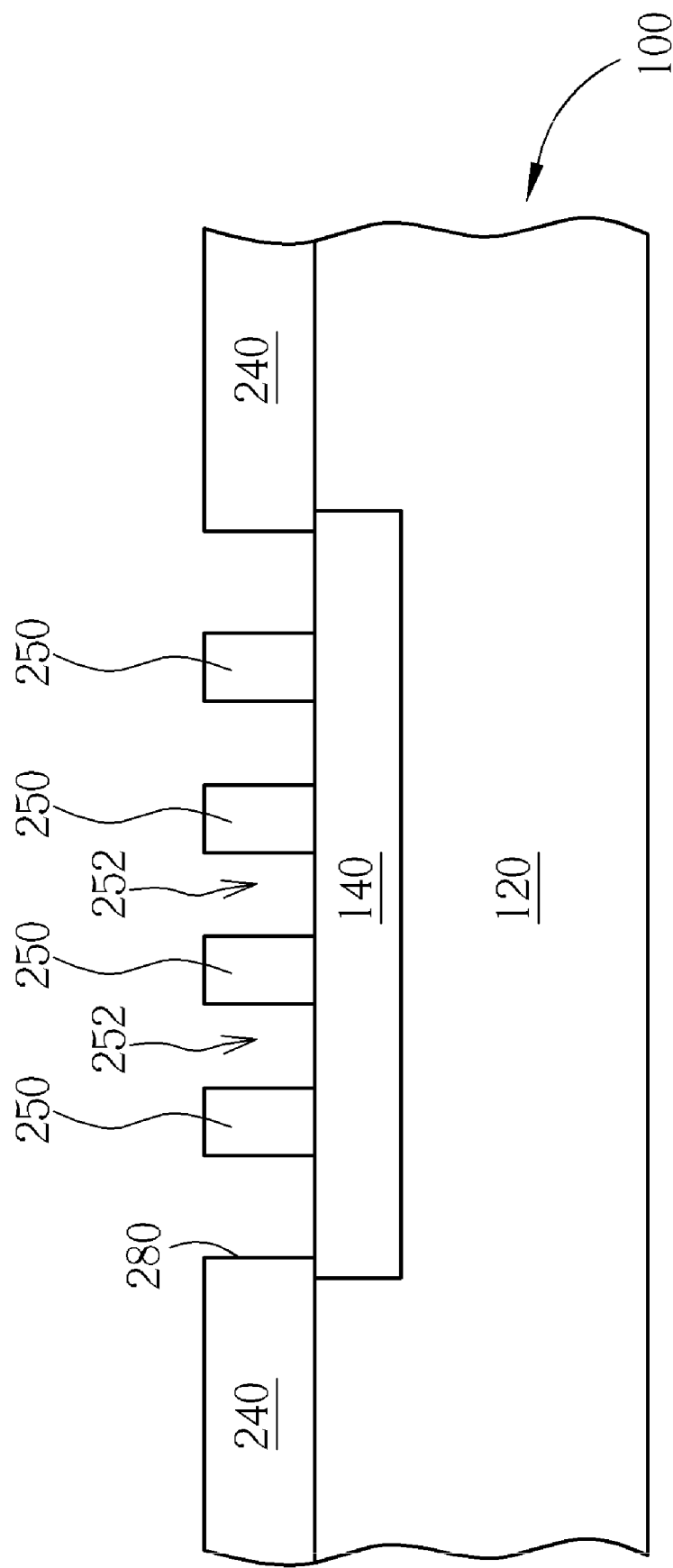

Subsequently, as shown in FIG. 3, lithographic and etching processes are carried out to pattern the passivation dielectric film 240. A via opening 280 is formed in the passivation dielectric film 240. The via opening 280 exposes a surface area of the copper wiring layer 140.

Simultaneously, a reinforcement pattern 250 is formed directly above the copper wiring layer 140 within the via opening 280. The reinforcement pattern 250 has inter-space 252 that exposes a portion of the underlying copper wiring layer 140.

Figure 7:
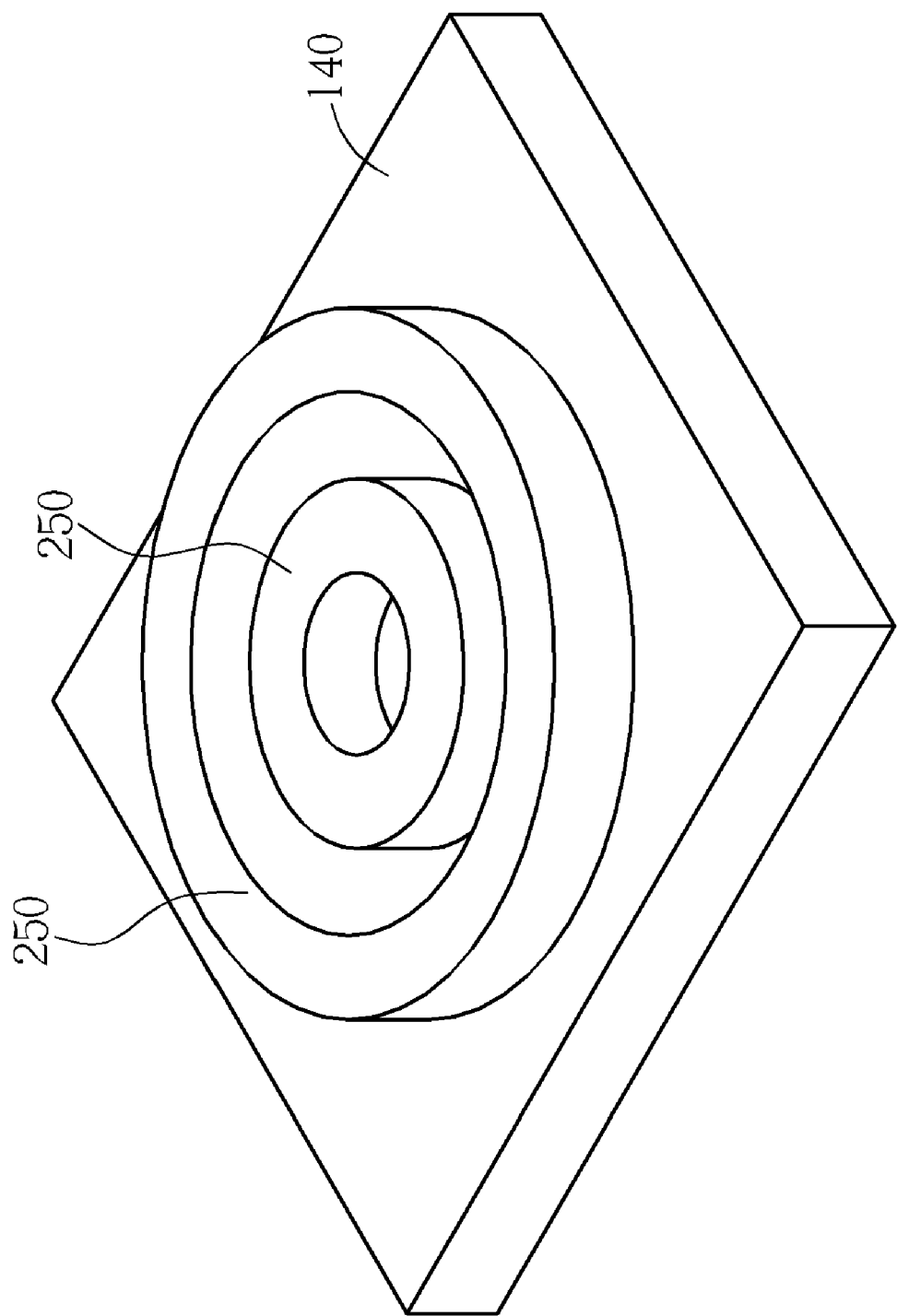
FIG. 7 is a perspective view of the preferred reinforcement pattern according to this invention.

The reinforcement pattern 250, which is the key feature of this invention, is designed to release the stress exerted by a probe tip during the subsequent probing process. FIG. 7 demonstrates a preferred reinforcement pattern 250 in a perspective view. As shown in FIG. 7, the reinforcement pattern 250 comprises two concentric annular circles. However, it is understood that other patterns can be employed to form the reinforcement pattern 250, for example, spiral shaped, curved line shaped, polygonal shaped patterns.

Figure 4:
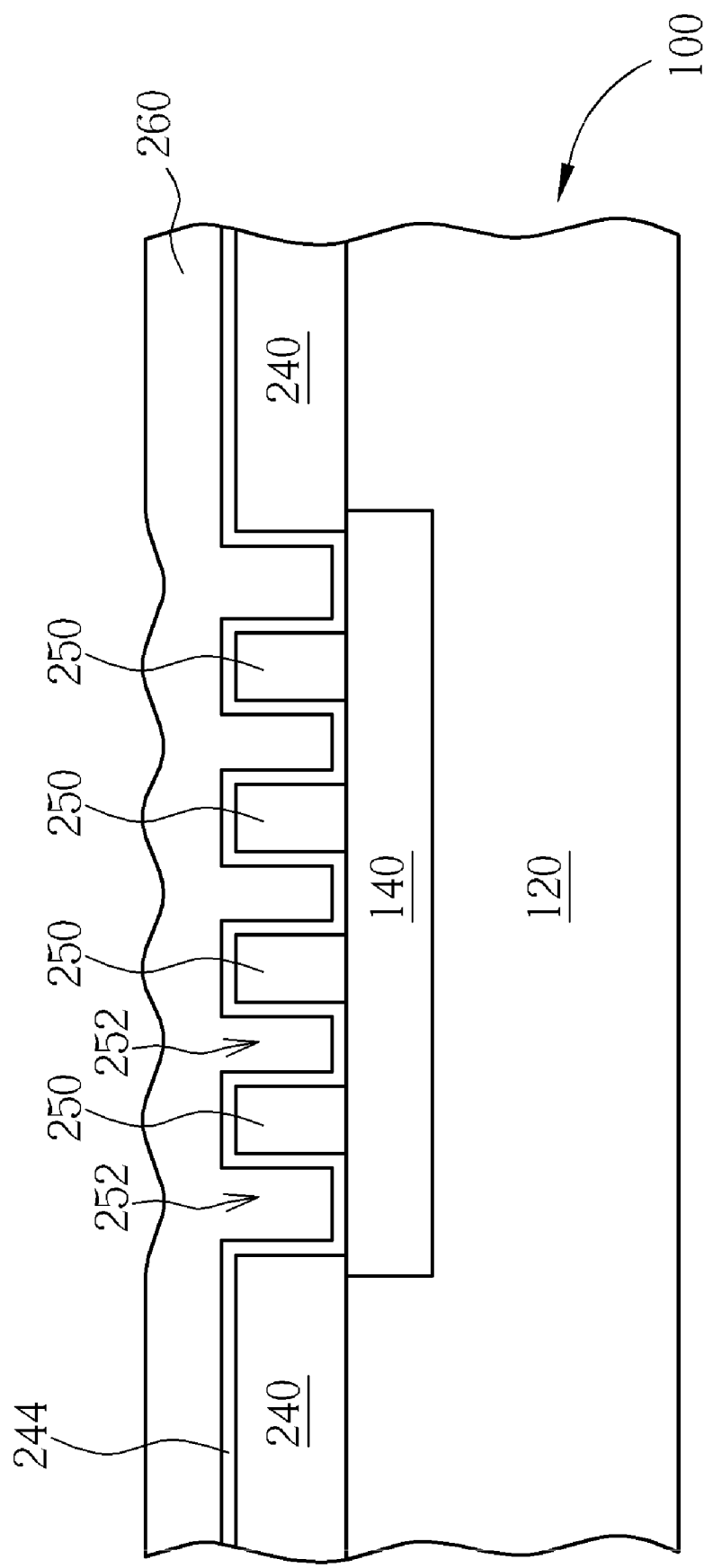

As shown in FIG. 4, a barrier layer 244 is deposited on the reinforcement pattern 250 and the exposed copper wiring layer 140, and also on the passivation dielectric film 240. The barrier layer 244 may include titanium nitride, tantalum nitride or the like, preferably tantalum nitride. A conductive layer 260 such as aluminum is then deposited on the barrier layer 244. The conductive layer 260 fills the inter-space 252.

Figure 5:
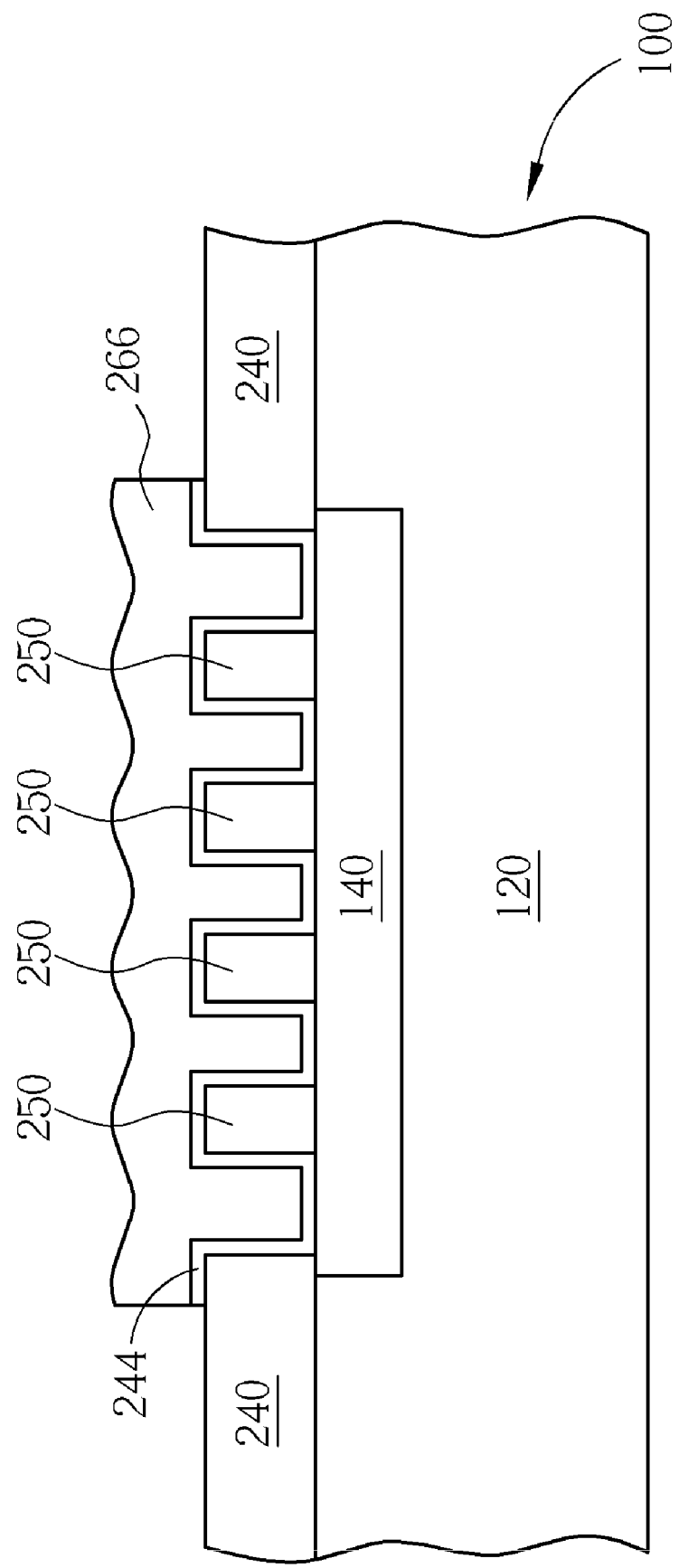
Figure 6:
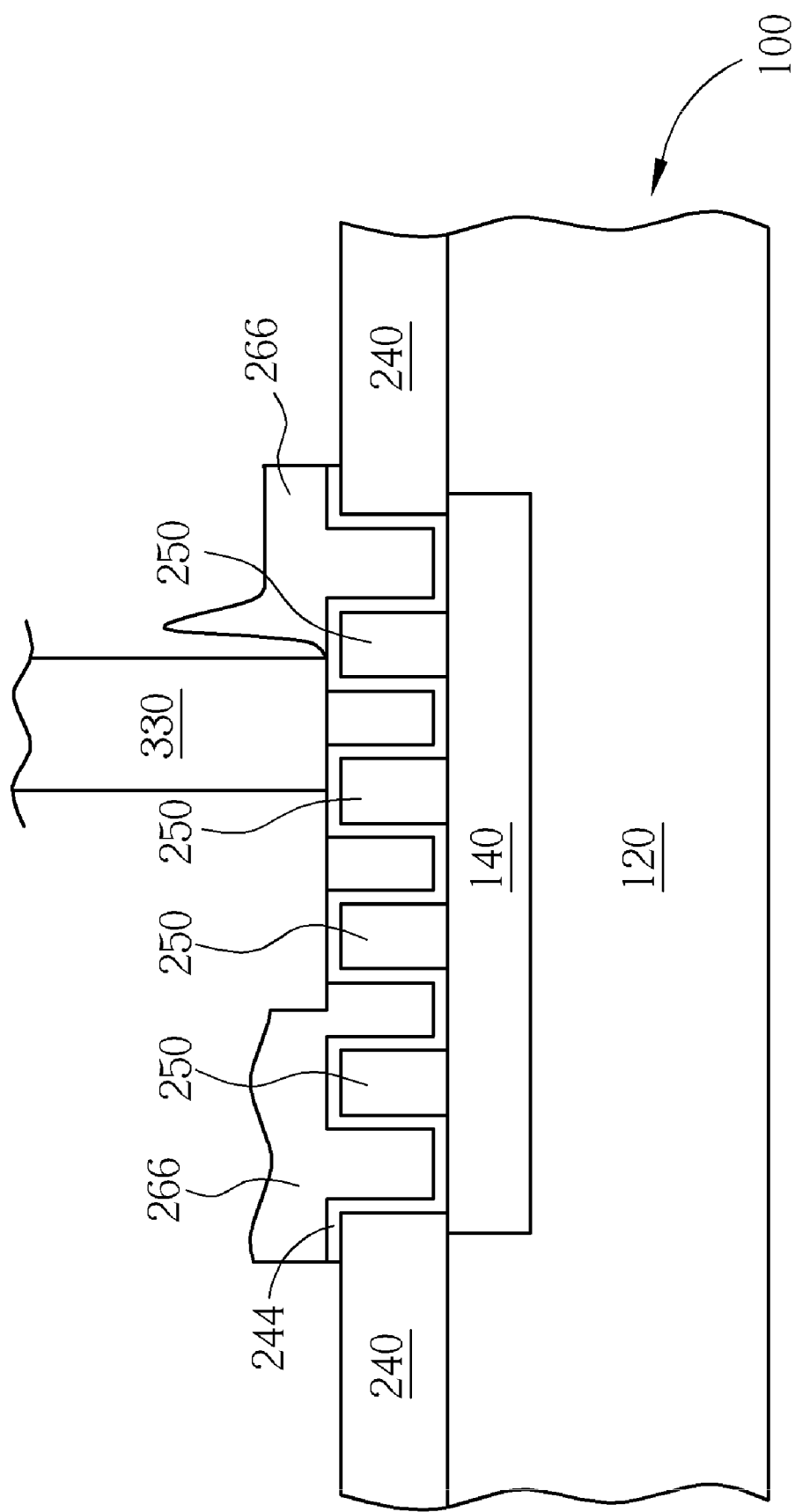

As shown in FIG. 5, a lithographic and etching process are carried out to pattern the conductive layer 260 and the barrier layer 244 into a conductive pad 266. As shown in FIG. 6, a probe tip 330 is moved down to touch the conductive pad 266. Due to overly large probing force, the probe tip 330 penetrates the conductive pad 266 and stopped by the reinforcement pattern 250, thereby avoiding the underlying copper wiring layer from exposure to air.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a probing pad of an integrated circuit chip, comprising the steps of:
    providing a substrate having thereon a dielectric layer;
    forming an inlaid metal wiring in the dielectric layer, wherein the inlaid metal wiring has an exposed top surface;
    covering the top surface of the inlaid metal wiring and the dielectric layer with a passivation dielectric film;
    etching away a portion of the passivation dielectric film to form a reinforcement pattern on the inlaid metal wiring, wherein the reinforcement pattern has inter-space that exposes a portion of the underlying inlaid metal wiring; and
    forming a conductive pad over the reinforcement pattern and the passivation dielectric film, wherein the conductive pad fills the inter-space of the reinforcement pattern.

2. The method according to claim 1 wherein the inlaid metal wiring comprises copper.

3. The method according to claim 1 wherein the passivation dielectric film comprises silicon oxide, silicon nitride, silicon oxy-nitride and polyimide.

4. The method according to claim 1 wherein the reinforcement pattern is concentric shaped.

5. The method according to claim 1 wherein the reinforcement pattern is spiral shaped, curved line shaped or polygonal shaped.

6. The method according to claim 1 wherein the conductive pad comprises aluminum.

7. The method according to claim 1 further comprising forming a barrier layer between the conductive pad and the reinforcement pattern.

8. The method according to claim 7 wherein the barrier layer comprises tantalum nitride.

9. The method according to claim 1 wherein the substrate comprises at least one semiconductor device.

10. The method according to claim 9 wherein the semiconductor device comprises MOS transistor, CMOS, memory, logic device or IC module.

11. The method according to claim 9 wherein the semiconductor device is electrically connected with the conductive pad via the inlaid metal wiring.

12. A method of probing an integrated circuit chip, comprising:
    providing an integrated circuit chip comprising a substrate having thereon a dielectric layer; an inlaid metal wiring in the dielectric layer, wherein the inlaid metal wiring has an exposed top surface; a passivation dielectric film covering perimeter of the inlaid metal wiring; a reinforcement pattern directly on the inlaid metal wiring, wherein the reinforcement pattern has inter-space that exposes a portion of the underlying inlaid metal wiring; a conductive pad over the reinforcement pattern and the passivation dielectric film, wherein the conductive pad fills the inter-space of the reinforcement pattern; and
    performing a probing test by depressing a probe tip on the conductive pad, wherein the probe tip produces a stress that is counteracted by the reinforcement pattern, thereby avoiding exposure of the inlaid metal wiring.

13. The method of probing an integrated circuit chip according to claim 12 wherein the inlaid metal wiring comprises copper.

14. The method of probing an integrated circuit chip according to claim 12 wherein the passivation dielectric film comprises silicon oxide, silicon nitride, silicon oxy-nitride and polyimide.

15. The method of probing an integrated circuit chip according to claim 12 wherein the reinforcement pattern is concentric shaped.

16. The method of probing an integrated circuit chip according to claim 12 wherein the reinforcement pattern is spiral shaped, curved line shaped or polygonal shaped.

17. The method of probing an integrated circuit chip according to claim 12 wherein the conductive pad comprises aluminum.

18. The method of probing an integrated circuit chip according to claim 12 further comprising a barrier layer between the conductive pad and the reinforcement pattern.

19. The method of probing an integrated circuit chip according to claim 12 wherein the barrier layer comprises tantalum nitride.

20. The method of probing an integrated circuit chip according to claim 12 wherein the substrate comprises at least one semiconductor device.

21. The method of probing an integrated circuit chip according to claim 20 wherein the semiconductor device comprises MOS transistor, CMOS, memory, logic device or IC module.

22. The method of probing an integrated circuit chip according to claim 20 wherein the semiconductor device is electrically connected with the conductive pad via the inlaid metal wiring.

* * * * *